United States Patent [19]

Ichikawa et al.

[11] 4,451,324

[45] May 29, 1984

[54] APPARATUS FOR PLACING CHIP TYPE CIRCUIT ELEMENTS ON A BOARD

[75] Inventors: Iwao Ichikawa, Kanagawa; Kenichiro Kaimori, Iwate, both of Japan

[73] Assignee: Sony Corporation, Tokyo, Japan

[21] Appl. No.: 135,668

[22] Filed: Mar. 31, 1980

[30] Foreign Application Priority Data

May 12, 1979 [JP] Japan ................................. 54-582021

[51] Int. Cl.³ ............................................. B32B 31/00
[52] U.S. Cl. ..................................... 156/562; 29/738; 29/739; 29/740; 29/757; 29/759; 29/832; 29/834; 156/299; 156/560; 156/561; 156/569; 221/93; 221/296; 414/126; 414/784
[58] Field of Search ............... 156/299, 562, 560, 569, 156/561; 221/93, 296; 269/321 A, 321 H, 321 WE; 29/738, 759, 739, 832, 740, 834, 757; 414/126, 784

[56] References Cited

U.S. PATENT DOCUMENTS

| 3,327,375 | 6/1967 | Reijnhard et al. | 29/757 |
| 3,566,464 | 3/1971 | Bakermans | 29/739 |
| 3,658,618 | 4/1972 | Gramann | 156/299 |
| 3,775,941 | 12/1973 | Bross | 221/296 |
| 3,963,456 | 6/1976 | Tsuchiya et al. | 29/739 |
| 4,160,893 | 7/1979 | Meyer et al. | 156/272 |

Primary Examiner—John J. Gallagher
Attorney, Agent, or Firm—Lewis H. Eslinger; Alvin Sinderbrand

[57] ABSTRACT

An apparatus for locating chip type circuit elements on a printed circuit board includes an accommodating assembly for temporarily storing said circuit elements supplied from hoppers, a movable shutter placed under the accommodating assembly, and which supports and rotates circuit elements within the accommodating assembly, and a template placed under the shutter to receive the circuit elements dropped from the accommodating assembly when the shutter is removed laterally from under the accommodating assembly.

12 Claims, 14 Drawing Figures

APPARATUS FOR PLACING CHIP TYPE CIRCUIT ELEMENTS ON A BOARD

BACKGROUND OF THE INVENTION

1. Field of the Invention

The present invention relates to an apparatus and a method for placing chip type circuit elements on a printed circuit board, and more particularly to an apparatus and a method for placing a plurality of chip type circuit elements on a board simultaneously.

2. Description of the Prior Art

Chip type circuit elements such as resistors, capacitors and diodes are well known. They are made of a bare bulk material provided with electrodes, and are often used for hybrid integrated circuits. When chip type circuit elements are to be mounted on a printed circuit board, conventionally, the chip type circuit elements are manually mounted one by one on the printed board.

When circuit elements are arrayed one by one at predetermined positions by workers, however, a tremendous amount of time and laborious work are required, resulting in a high manufacturing cost. It has therefore been attempted to array the circuit elements at predetermined positions by conveying them through cylindrical pipes by the force of gravity or pneumatic pressure. When cylindrical leadless or chip type circuit elements are conveyed through cylindrical pipes, however, they reach the bottom of the pipes in vertically oriented attitude. The circuit elements therefore must be turned into a horizontal position by some means. Moreover, unless they are turned in the correct direction, polarized elements such as diodes will not be properly arrayed. Furthermore, circuit board design efficiency will be improved if many circuit elements are turned in a plurality of directions in one operation.

SUMMARY OF THE INVENTION

One object of the present invention is to provide a novel apparatus which is capable of arraying many chip type circuit elements on a board through one operation.

Another object of the present invention is to provide an apparatus which is capable of arraying cylindrical chip type circuit elements on a board with the proper orientation, and which can be conveniently adapted to perform this function in a variety of boards.

A further object of the present invention is to provide an apparatus which in one operation is capable of turning in a plurality of directions many cylindrical chip type circuit elements which are supplied in a vertically oriented state or attitude, by means of a simply constructed device.

A further object of the present invention is to provide an apparatus which is capable of arraying chip type circuit elements of dissimilar sizes on a board in such a manner that their upper surfaces are all at one level.

A further object of the present invention is to provide an apparatus which is capable of easily transferring onto a printed circuit board chip type circuit elements that are arrayed on a template with the proper orientations.

The structure of the present invention includes an apparatus for placing chip type circuit elements on a board, comprising:

hoppers for accommodating a plurality of cylindrical chip type circuit elements;

a plurality of accommodating means for temporarily accommodating circuit elements released from said hoppers;

laterally movable shutter means having an operative position under said accommodating means to support said circuit elements accommodated in each of said accommodating means and an inoperative position removed from under the latter; and a template which is placed under said shutter means and which has a plurality of receiving portions respectively corresponding to said accommodating means;

wherein when said shutter means is moved laterally by a predetermined distance, in said operative position, said circuit elements are turned in said plurality of accommodating means, and when said shutter means is removed from said accommodating means, to said inoperative position, said circuit elements are allowed to fall onto said receiving portions of said template.

The above, and other objects, features and advantages of the present invention will become apparent from the following detailed description of illustrative embodiments thereof which is to be read in connection with the accompanying drawings in which like reference numerals designate corresponding elements and parts.

DESCRIPTION OF THE PREFERRED EMBODIMENT

The invention is described and illustrated below with reference to an embodiment in which the invention is applied to an apparatus for arraying the circuit elements in a system for producing hybrid integrated circuits. In the system for producing hybrid integrated circuits, small chip type circuit elements are supplied from hopper or storage means by extraction means and are guided to predetermined positions on a template via arraying means. Adhesive resins are printed in corresponding positions on a printed circuit board. The circuit board is then placed on the template holding the circuit elements, causing the chip type circuit elements to adhere to the printed substrate by means of the adhesive resin. The adhesive resin is hardened by means of irradiation with light and heat in order to at least temporarily fasten the circuit elements. Cap-like lead attachment points or electrodes at both ends of the chip type circuit elements are then electrically connected to electrically conductive patterns of the printed substrate by means of solder dipping, thereby forming the intended circuit.

Figure 1:
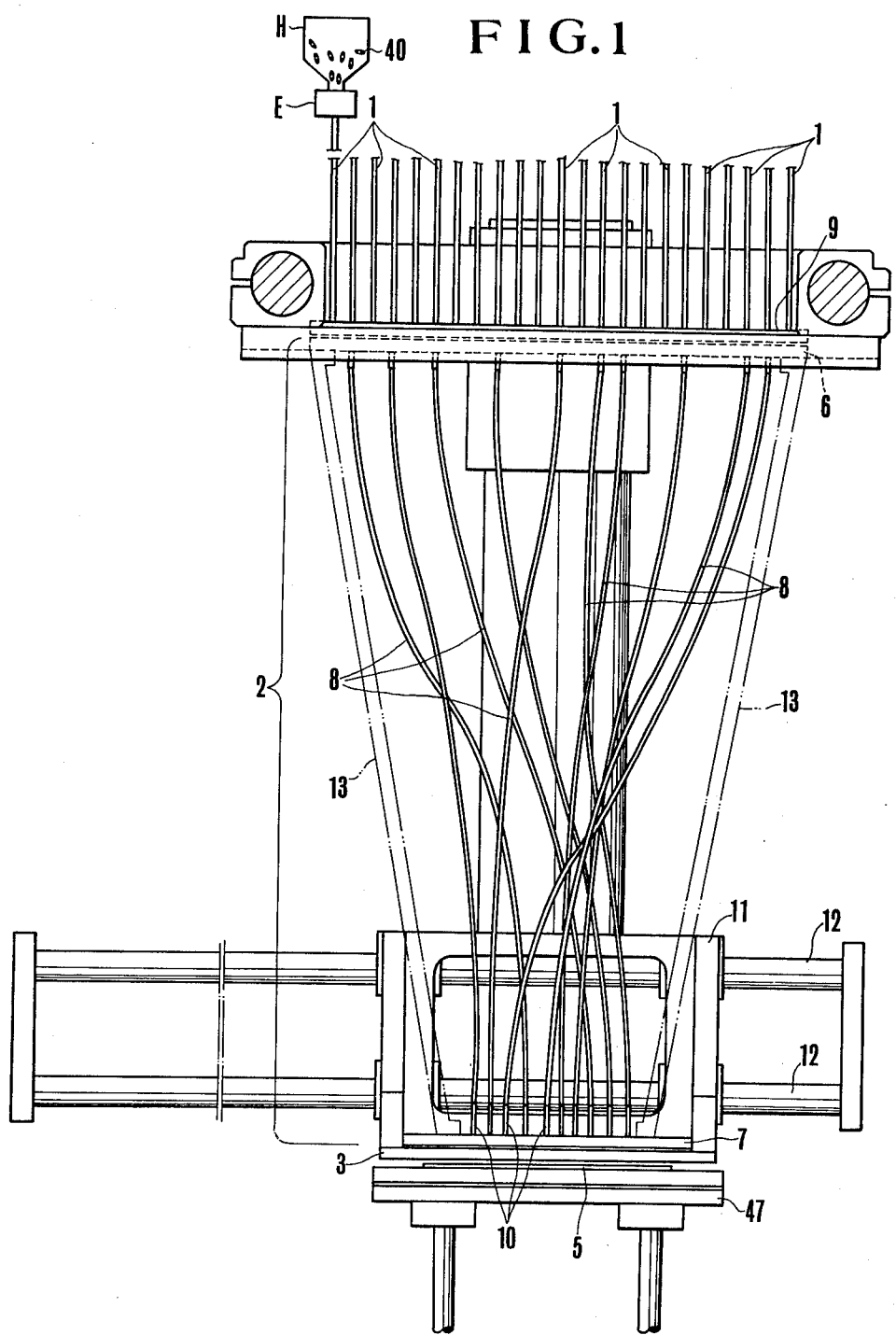
FIG. 1 is a front view schematically illustrating a production system according to an embodiment of the present invention, and which involves placing chip type circuit elements in a system for manufacturing hybrid integrated circuits.

Referring in detail to FIG. 1, it will be seen that circuit elements are selected and extracted from hoppers H (only one of which is shown) by extraction devices E and are allowed to fall through pipes 1, whereupon the circuit elements are guided into accommodating means 3 via an accommodating magazine 2. Although FIG. 1 shows only one hopper H, each of the pipes 1 is connected to a hopper H and an extraction device E. The circuit elements guided into the accommodating means 3 are rotated by a shutter 25 later described with reference to FIG. 2, and are received in accommodating recesses 39 of a template 5 when the shutter is opened. A printed circuit board is then placed on template 5, the board having applied thereto an adhesive resin as mentioned above, and the circuit elements are transferred to the printed board.

The accommodating magazine 2 consists of an upper plate 6, a lower plate 7, and pipes 8 which communicate between upper plate 6 and lower plate 7.

A connection plate 9 is placed on upper plate 6 of the magazine 2. Holes in the connection plate 9 communicate with the pipes 1 and with corresponding holes in upper plate 6. Circuit elements that have fallen through the pipes 1 are introduced into the pipes 8 of the magazine 2 through the holes formed in the upper plate 6 of the magazine 2. The lower ends of the pipes 8 of the magazine 2 are connected to the lower plate 7 through connection pipes 10, through which chip type circuit elements that fall through the pipes 8 are guided into holes 18 formed in lower plate 7 and thence into the accommodating means 3.

The accommodating means 3 and the lower plate 7 are supported by a frame 11 which is mounted to move to the right and left, as seen in FIG. 1, along two rods 12 attached to the back side thereof.

Furthermore, upper plate 6 and lower plate 7, together constituting magazine 2, are coupled together by assembling frames 13, as indicated by dot-dash lines in FIG. 1. Because the upper plate 6 and the lower plate 7 are connected by the assembling frames 13, the magazine 2 can be constructed as a unitary structure. When the upper plate 6 is disconnected from the connection plate 9, the lower plate 7 is disconnected from the acommodating means. Thus, when the magazine 2 is moved toward the left in FIG. 1 by moving the frame 11, the entire magazine 2 can be removed from the production system. In practice magazines are designed and prepared in advance according to the particular lots of circuit boards to be manufactured, and a different magazine is inserted for each respective lot. Accordingly, the pipes 8 need not be disconnected and reconnected each time a new lot is to be manufactured, making it possible to minimize the preparation time required for changing the lot.

Figure 2:
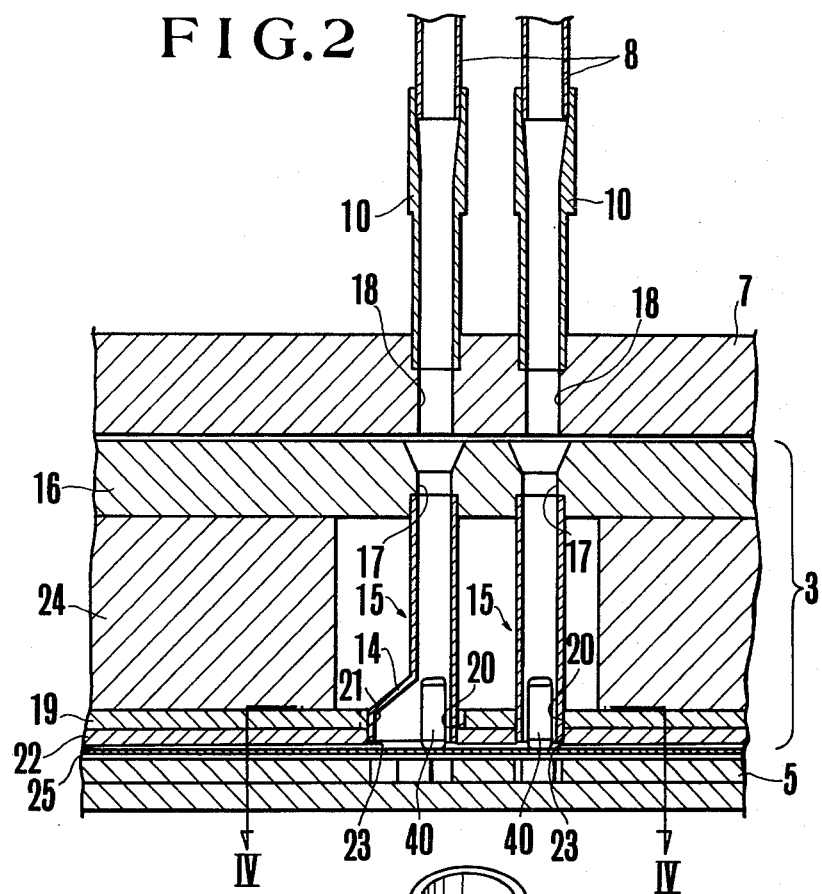
FIG. 2 is a cross-sectional view illustrating, on an enlarged scale, major portions of the apparatus.
Figure 3:
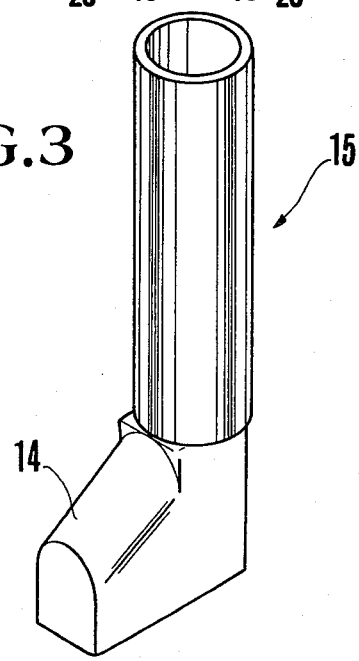
FIG. 3 is a perspective view of a guide for turning the circuit elements.

The accommodating means 3 disposed beneath the lower plate 7 of the magazine 2 has a boot-like guide 15 in which the circuit elements are rotated, as shown in FIGS. 2–5, inclusive. The vertical portion of guide 15 is cylindrical, as shown in FIG. 3, and at its lower end a protruded portion 14 extends horizontally like the foot of a boot. In FIG. 2, the protruded portion 14 of one guide 15 is shown, while the protruded portion of another guide is not shown because in this view it is oriented in a direction toward or away from the viewer. See FIG. 4. Thus, the protruded portion 14 of each guide 15 may be oriented in any direction. The upper and lower ends of the guide 15 are open. The upper end of the guide 15 is supported by a holder plate 16 which constitutes the top portion of the accommodating means 3. Holes 17 are formed in the holder plate 16 to communicate with the upper ends of the guides 15, as well as with holes 18 formed in the lower plate 7.

Figure 4:
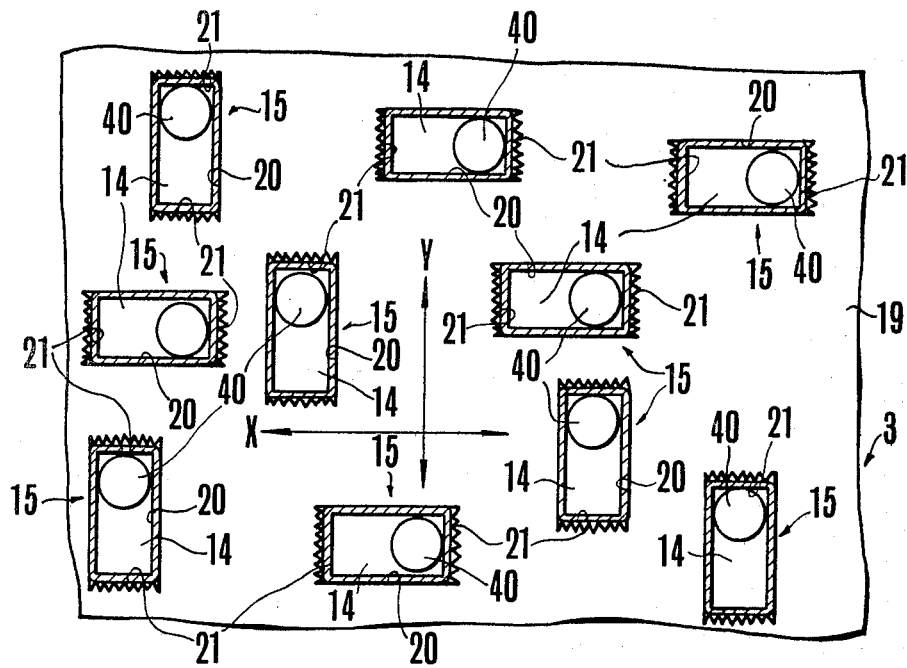
FIG. 4 is a cross-sectional view of a disposition plate as viewed along line IV—IV on FIG. 2.

The lower ends of the guides 15 are held by a fastening plate 19, as shown in FIG. 4. Rectangular through holes 20 of a shape and size nearly equal to those of the lower ends of the guides 15 are formed in the fastening plate 19. Ridged fastening portions 21 are formed at the opposite end edges of the through holes 20. Owing to the fastening portions 21, the guides 15 are detachably fastened to the fastening plate 19. The lower surface of the fastening plate 19 is placed on a bottom plate 22 of the accommodating means 3. Through holes 23 of nearly the same size as the rectangular through holes 20 are formed in the bottom plate 22 and correspond to the through holes 20. The through holes 20 in the fastening plate 19 and the through holes 23 in the bottom plate 22 are oriented parallel to either the x-axis or the y-axis of the accommodating means 3, as shown in FIG. 4. Further, a spacer 24 is interposed between the holder plate 16 and the fastening plate 19 of the accommodating means 3.

Figure 6:
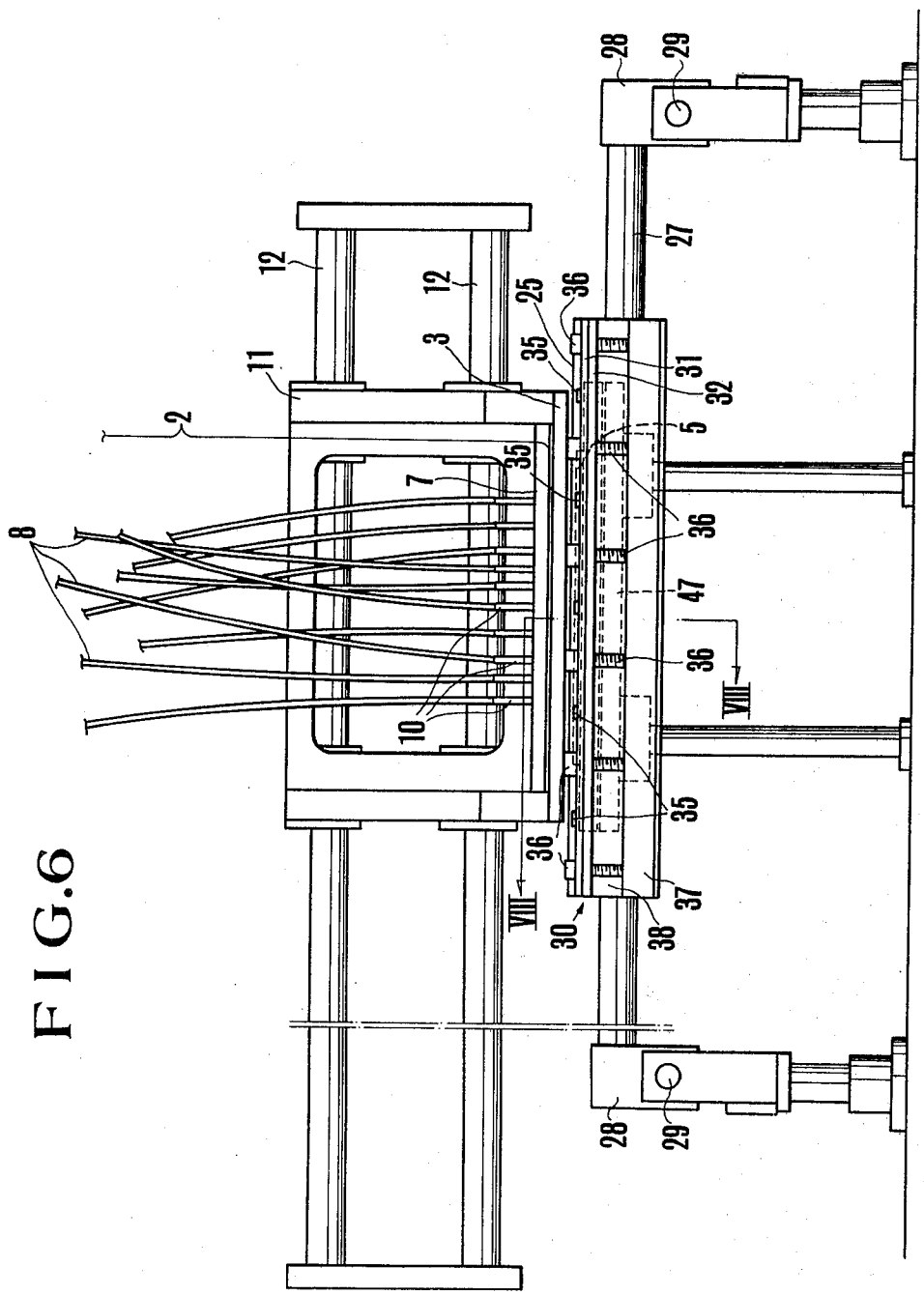
FIG. 6 is a front view illustrating the lower portion of the system for placing circuit elements.
Figure 7:
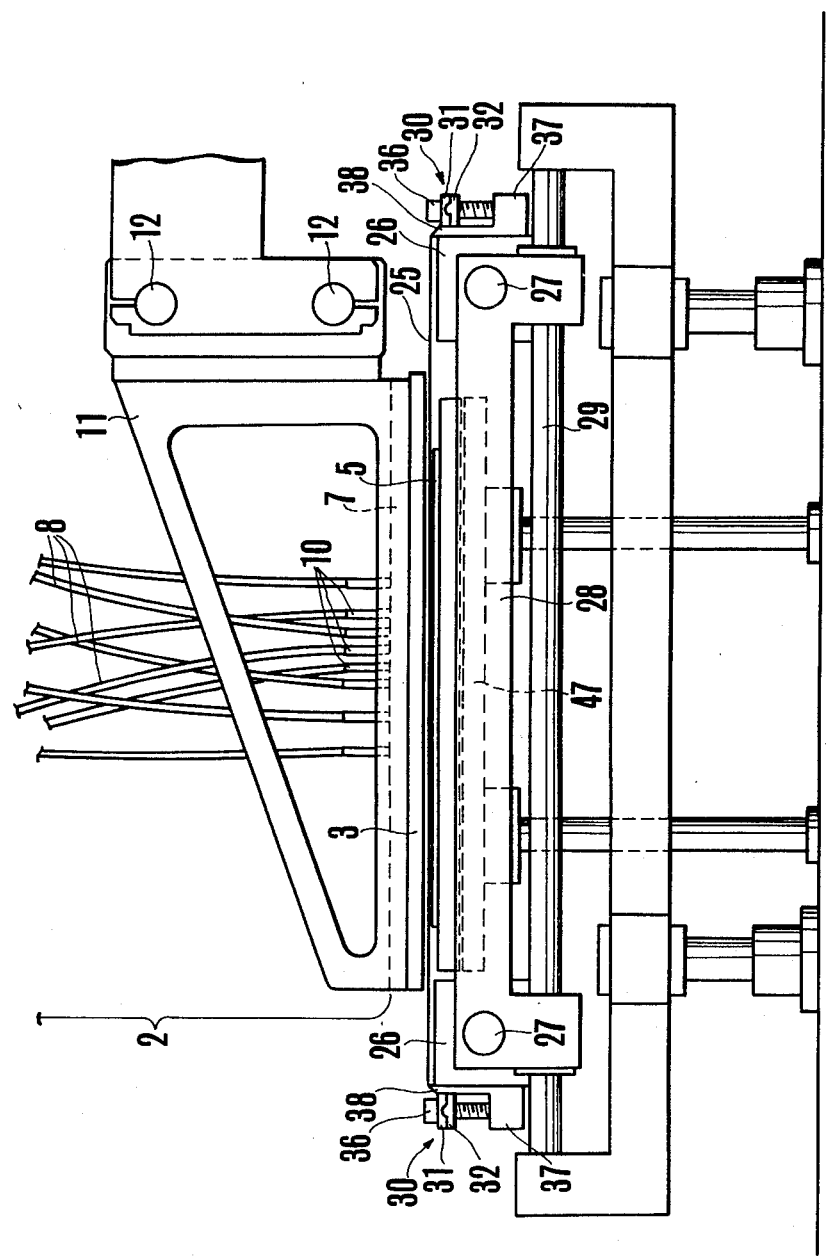
FIG. 7 is a side view of the apparatus appearing on FIG. 6.

With specific references to FIGS. 6–9, inclusive, it will be seen that the earlier briefly mentioned shutter 25 is movably disposed beneath the accommodating means 3. The shutter 25 consists of a stainless steel plate of a thickness of 0.1 mm to 0.15 mm and is supported by a frame 26. The frame 26 which supports the shutter 25 is so constructed as to move in both the lengthwise direction and the widthwise direction relative to the accommodating means 3, by means of two support means. First, the frame 26 is supported by two rods 27 and is allowed to slide along these rods in the right and left directions, as seen in FIG. 6. The ends of the rods 27 are fastened to two rod support members 28. Second, the rod support members 28 are supported by rods 29, and are allowed to slide in the right and left directions, as seen in FIG. 7. In short, the shutter 25 is capable of moving in the lengthwise direction and in the widthwise direction with respect to the accommodating member 3 through being supported by rods 27 and rods 29 which are arrayed at right angles to one another.

Figure 8:
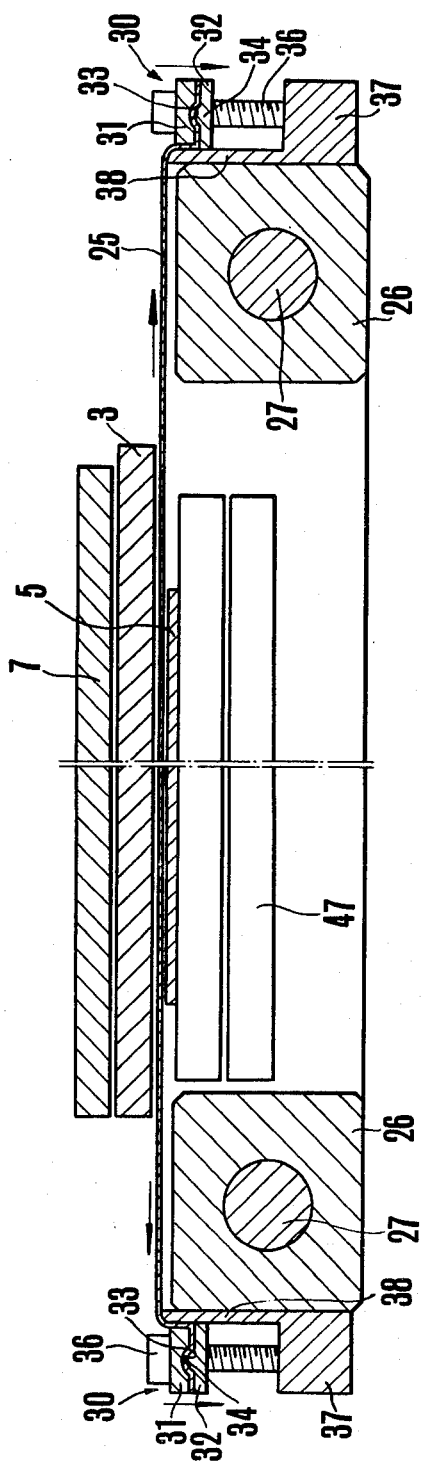
FIG. 8 is a cross-sectional view along the line VIII—VIII of FIG. 6.
Figure 9:
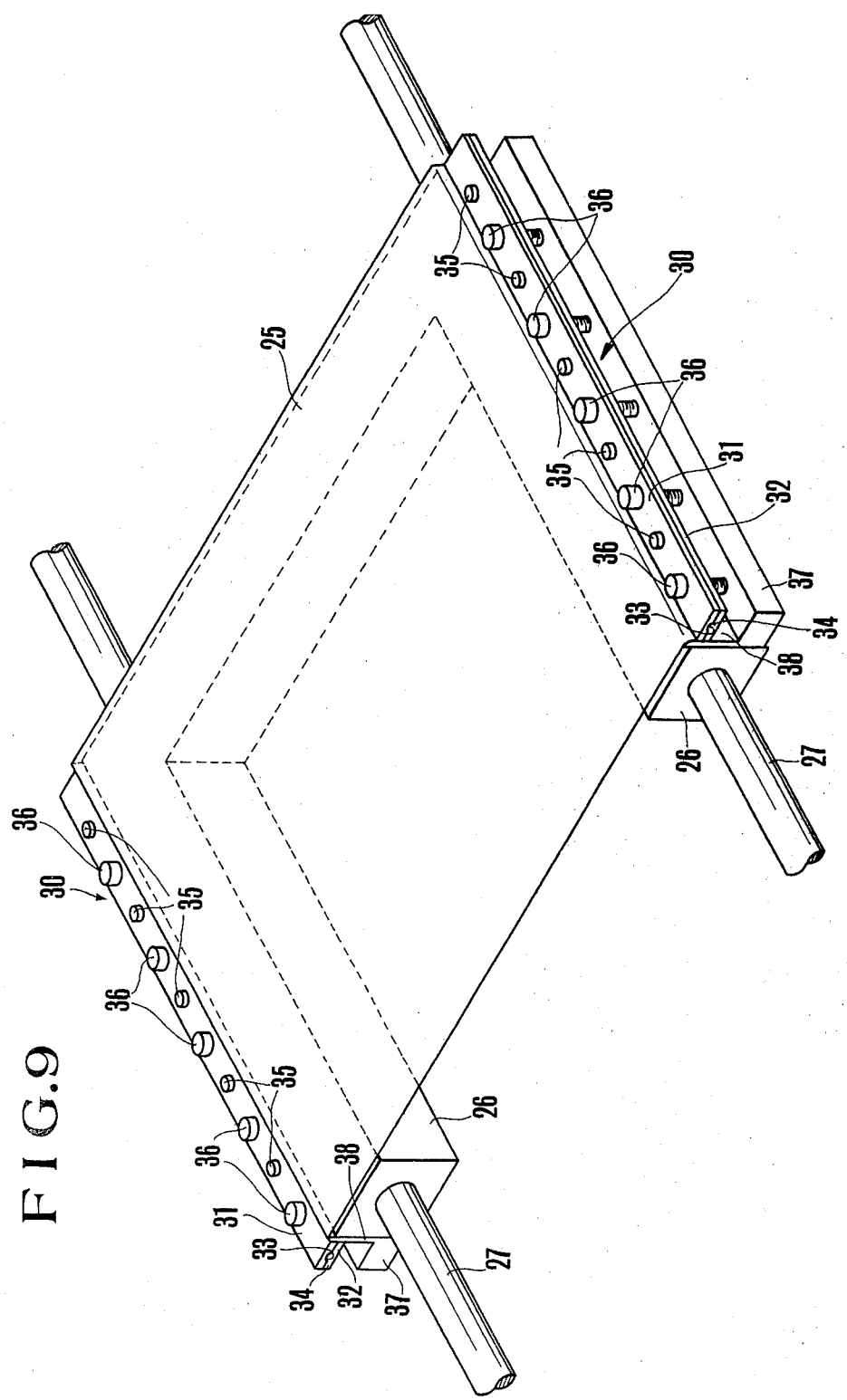
FIG. 9 is a perspective view illustrating a shutter and means for supporting it.

With reference to FIGS. 8 and 9, it will be seen that shutter 25 is supported by the frame 26 in a stretched manner under a predetermined tensile force. Specifically, the front and rear edges of shutter 25, that is, the edges parallel to rods 27, are fastened by clamp holders 30 which each comprise a pair of narrow upper and lower plates 31 and 32, respectively. A groove 33 of a semicircular shape in cross section is formed in the lower surface of the upper plate 31, and a ridge 34 of a semicircular shape in cross section is formed on the upper surface of the lower plate 32. Upper plate 31 and lower plate 32 are fastened together by clamp bolts 35, thus holding an edge of the shutter 25 sandwiched between the groove 33 and the ridge 34.

Each clamp holder 30 holding the shutter 25 is attached to a tension holder 37 by tension-adjusting bolts 36. The tension-adjusting bolts 36 and the clamp bolts 35 are arrayed alternately along the length of each clamp holder 30. The tension holders 37 are fastened to the outsides of the front and rear of the frames 26 in the form of a flange. A protrusion 38 is integrally formed on the tension holder 37 along its entire length and extends vertically from it. The top portion of protrusion 38 has nearly a semicircular shape in cross section so that it will not scar the shutter 25 of stainless steel. The top portion of the protrusion 38 projects slightly above the upper surface of frame 26, between frame 26 and clamp holders 30, in which the edges of shutter 25 are held. Thus, shutter 25 is supported at the front and rear of frame 26 by protrusions 38. Accordingly, when tension-adjusting bolts 36, which hold clamp holders 30 to tension holders 37, are tightened, a tensile force is exerted on shutter 25, and thus the shutter 25 is stretched tightly across the frame 26. Therefore, sufficient flatness is obtained in spite of the thinness of the plate forming the shutter 25, and slack in the shutter 25 is effectively eliminated. Further, owing to its high degree of flatness, the shutter can be brought very close to both the accommodating means 3 and the template 5.

Figure 10:
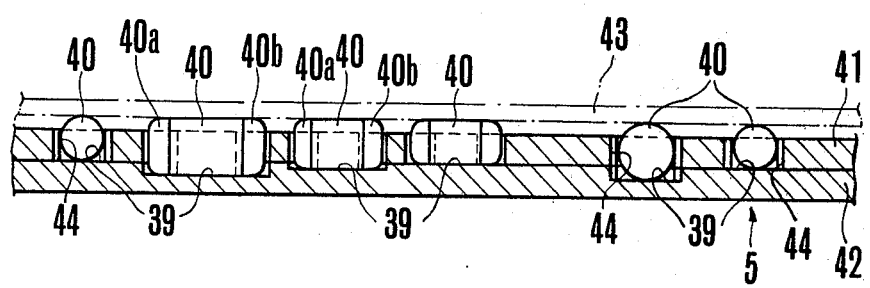
FIG. 10 is a cross-sectional view of a template.
Figure 12:
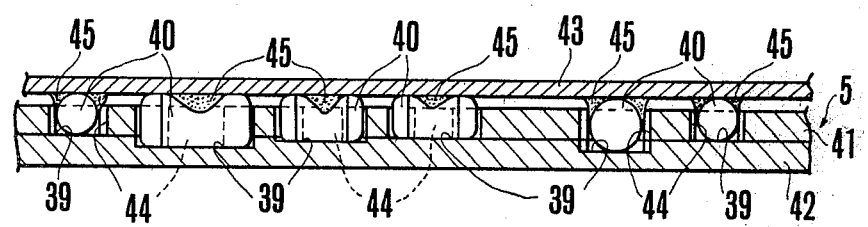
FIG. 12 is a cross-sectional view of the template on which has been placed a printed circuit board.

As shown in FIG. 10, the template 5 consists of two plates 41 and 42 which are laminated together. Recesses 39 are formed in the template 5 to accommodate chip type circuit elements 40. Each circuit element 40 has a pair of electrodes 40a and 40b, and is formed nearly in a cylindrical shape. FIG. 10 illustrates a template 5 for accommodating two kinds of chip type circuit elements 40 having dissimilar diameters. Recesses 39 for accommodating circuit elements 40 of a small diameter consist of through holes formed in the upper plate 41 only. Recesses 39 for accommodating circuit elements 40 having a large diameter consist of through holes formed in the upper plate 41 and recesses formed in the lower plate 42. Thus, the depth of recesses 39 are varied depending upon the sizes of the circuit elements so that, when a printed substrate 43 to which an adhesive agent 45 has been applied, is placed on the template 5, as shown in FIG. 12, the individual circuit elements 40 contact the printed board 43 under nearly the same pressure irrespective of the size of the circuit elements 40. In other words, the circuit elements 40 accommodated in the recesses 39 of the template 5 extend nearly the same distance above template 5, irrespective of their diameters.

Figure 11:
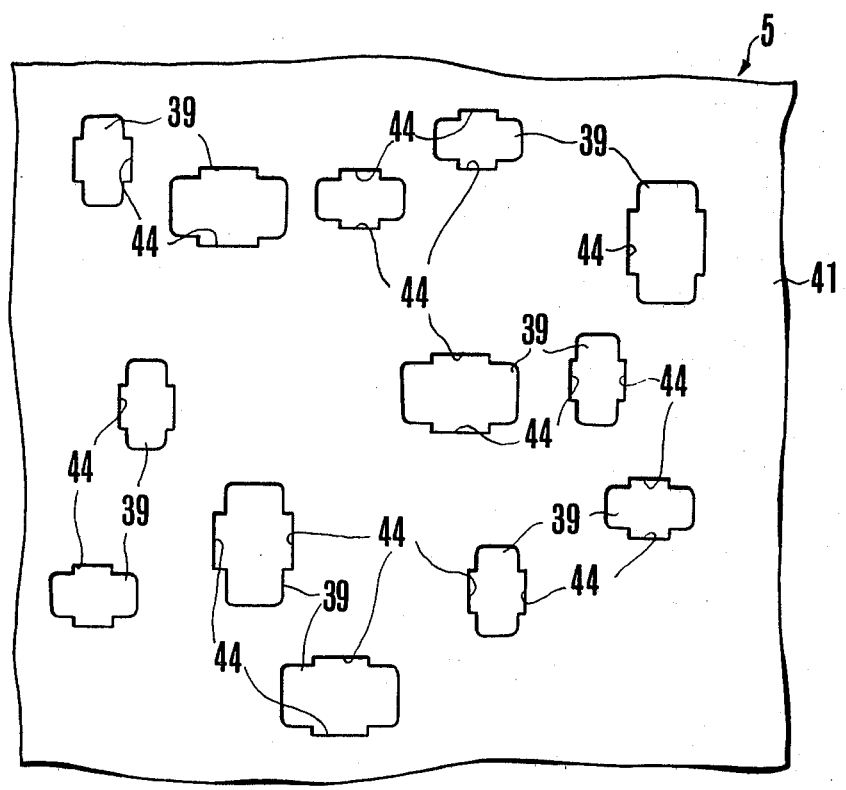
FIG. 11 is a plan view illustrating a portion of a template.

Further, as illustrated in FIGS. 11 and 12, opposing notches 44 are formed in both sides of each recess 39 of the template 5. When the printed board 43 onto which is applied adhesive agent 45 is placed on the template 5, any excess adhesive agent 45 enters notches 44, and thus does not adhere to template 5. The chip type circuit elements 40 have a cylindrical shape with cap-like connection terminals or electrodes at both ends, as earlier mentioned. The central portion, rather than the ends, of each circuit element 40, is secured by the adhesive agent 45 to the printed substrate 43. Thus, the circuit elements 40 are transferred from the template 5 to the printed board 43.

Figure 13:
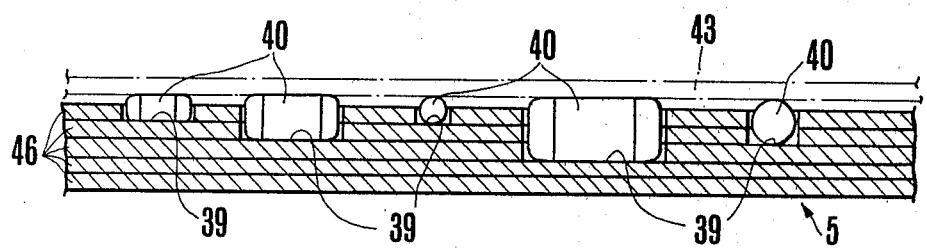
FIG. 13 is a cross-sectional view illustrating a modified embodiment of the template.
Figure 14:
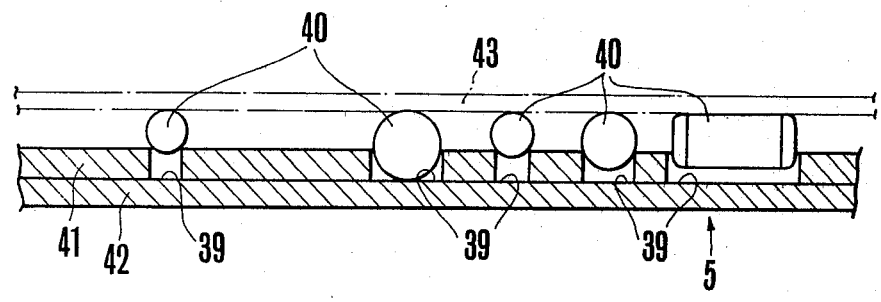
FIG. 14 is a cross-sectional view illustrating another modified embodiment of the template.

As earlier mentioned, in the template 5 illustrated in FIG. 10, the recesses 39 for accommodating large circuit elements 40 consist of through holes formed in the upper plate 41 and recessed portions formed in the lower plate 42, so that the height of large circuit elements above template 5 is the same as that of small circuit elements 40. As illustrated in FIG. 13, however, the template 5 may be composed of many, for example, five, thin plates 46. In this case, the number of plates formed with through holes is changed depending upon the size of the circuit elements 40, thereby forming recesses 39 of a depth corresponding to the diameter of the circuit elements 40. By employing such a template 5, the height of the circuit elements can be adjusted to be nearly even irrespective of the size of the circuit elements 40, as shown in FIG. 13. In another example, shown in FIG. 14, by means of varying the width of the recesses 39 formed in the template 5, the height of the circuit elements 40 accommodated in the recesses 39 can also be adjusted to be nearly even. In this case, the circuit elements 40 do not come into complete contact with the bottoms of the recesses 39 but rather are supported on the upper edges of recesses 39. To form recesses 39 in the template 5, in this example, it is necessary to form through holes or recessed portions in the plates which form template 5. In this case, the through holes or the recessed portions should preferably be formed by chemical etching, because the etching technique can maintain high machining precision without developing burrs, and further makes it possible to form many through holes or recessed portions in a single operation.

As illustrated in FIGS. 1, 6, 7 and 8, the template 5 is located on the holder plate 47 which is so constructed as to descend with the template 5 located thereon after the circuit elements 40 have been properly accommodated in the template 5. Accordingly, the template 5 is lowered and moved away from the accommodating means 3 and the shutter 25 to a position where the next operation is effected, i.e., where the printed board 43 is placed thereon.

The operation of the preferred embodiment of the present invention is described below.

Referring to FIGS. 1 and 2, the chip type circuit elements 40 supplied from the hoppers H reach the magazine 2 through pipes 1, fall freely through pipes 8 of the magazine 2, pass through connection pipes 10, which are connected to the pipes 8, and reach the accommodating means 3. The circuit elements 40 pass through the holes 17 formed in the holder plate 16 of the accommodating means 3 into guides 15, in which the rotation operation takes place. Up to this stage, the chip type circuit elements 40 are allowed to fall freely end-first, that is, in the directions of their longitudinal axes. Accordingly, the circuit elements 40 enter guides 15 in a vertical attitude as shown in FIG. 2 in contact with the upper surface of the shutter 25.

Figure 5:
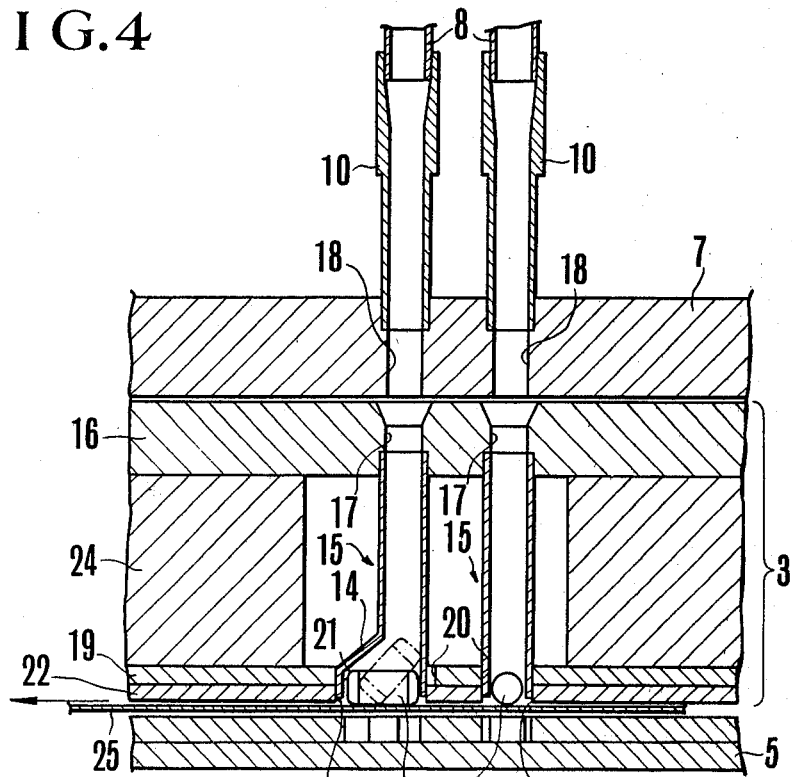
FIG. 5 is a cross-sectional view similar to FIG. 2, which illustrates the operation of the chip type circuit elements.

At this point, the shutter 25 is moved so that the chip type circuit elements 40 are rotated, as shown in FIG. 5. The frame 26 supporting the shutter 25 is moved to the right and to the left along rods 27, as shown in FIG. 6, thus moving shutter 25 in the direction X, as shown in FIG. 4. As the shutter 25 is moved in the direction X, the circuit elements in those of the guides 15 whose protruded portions 14 are oriented in the direction X, as represented by the guide 15 on the left side of FIG. 2, are turned. With specific reference to FIGS. 2 and 5, as the shutter 25 is caused to move leftwards, the circuit element 40 in the guide 15 rotates from a vertical orientation to a horizontal position as its lower end is moved laterally. Further, the portion 14 may be dimensioned so that the lower end of circuit element 40 enters into the protruded portion 14 of guide 15, while the upper end is blocked from so entering. Therefore, using the apparatus of the present invention, polar circuit elements 40 such as polar capacitors and diodes can be properly arrayed. The length of the stroke of the shutter 25 required in order to turn the circuit elements must be slightly greater than the length of the circuit elements 40, and may be a very small stroke relative to the size of the whole apparatus. After the preceding rotation has been completed, the circuit elements 40 held in guides 15 whose protruded portions 14 are oriented toward the right, as shown in FIG. 4, are rotated by means of a symmetrical motion of shutter 25 toward the right.

Thus the circuit elements 40, supported by shutter 25 in the guides 15 with orientation in the direction X, as shown in FIG. 4, are all rotated into a horizontal position. The shutter 25 is then caused to move in the direction Y of FIG. 4, by moving the rod support members 28 in the right and left directions along the rods 29 as shown in FIG. 7. Accompanying this movement, the frame 26, shutter 25, and rods 27 move in the same direction. As the shutter 25 moves to the right and left in the direction Y of FIG. 4, the circuit elements 40 supported by shutter 25 in the guides 15 with orientation in the direction Y, are all caused to rotate into a horizontal position. Thus, the circuit elements 40 in the guides oriented in either the X or the Y direction are all rotated. At this point the shutter 25 is still interposed between the accommodating means 3 and the template 5, and the chip type circuit elements 40 are held at their side surfaces by the guides 15 and are supported at their lower surfaces by the shutter 25.

Next, the shutter 25 and frame 26 are moved a greater distance toward the left or the right, as seen in FIG. 6, along the rods 27, thus opening the shutter 25. The moving stroke of the shutter 25 in this case is slightly greater than the total length of the accommodating means 3, and is sufficient to move the shutter 25 completely away from the lower portion of the accommodating means 3. The frame 26 supporting the shutter 25 has an open side as shown in FIG. 9, so that the movement of the shutter is not limited thereby. As the shutter 25 moves, the chip type circuit elements 40 which had been supported by the shutter 25 fall into the recesses 39 in the template 5 which is disposed beneath the accommodating means 3.

The shutter 25 is made of very thin steel, as mentioned earlier, and is supported under a predetermined tensile force, thus maintaining a high degree of flatness. Therefore, the template 5 is disposed very close to the accommodating means 3. Accordingly, the portion of the circuit element 40 which protrudes beyond the recess 39 of the template 5 is very precisely guided by the opening in the lower end of the guide 15 or by the edge of the hole 23 formed in the bottom plate 22 of the accommodating means 3, into the recess 39 formed in the template 5 after the shutter 25 has been opened.

After the horizontally disposed chip type circuit elements 40 have been properly seated in the recesses, the template 5 is lowered together with the plate 47 and moved away from the accommodating means 3. Thereafter, as shown in FIG. 12, template 5 is taken out from the apparatus and a printed board 43 on which is applied adhesive resin 45 is placed upon it. Because notches 44 have been formed on both sides of the recesses 39 of the template 5, any excess adhesive agent 45 does not adhere to the template 5. When the printed board 43 is placed on the template 5 and is pressed onto the template under the application of a predetermined force, the circuit elements 40 in the recesses 39 of the template 5 are attached to the printed board 43 by the adhesive agent 45. Thereafter, the combination of the template 5 and the printed board 43 is turned over, with the printed substrate 43 on the lower side and the template 5 on the upper side. The template 5 is removed and the chip type circuit elements 40 remain on the printed board 43. The printed board 43 is then introduced into an optical hardening furnace and a thermal hardening furnace in order to solidify the adhesive agent 45 and thereby temporarily fasten the chip type elements 40 to the printed board 43 in a reliable fashion. Then the cap-like leads or electrodes at both ends of the chip type circuit elements 40 are connected to the electrically conductive patterns of the printed board 43 by means of solder dipping, for permanently securing elements 40 to board 47 and thereby completing the preparation of the desired hybrid integrated circuit.

Although illustrative embodiments of this invention have been described in detail herein with reference to the accompanying drawings, it is to be understood that the invention is not limited to those precise embodiments, and that various changes and modifications may be effected therein by one skilled in the art without departing from the spirit and scope of the invention, as defined in the appended claims.

What is claimed is:

1. An apparatus for placing chip type circuit elements on a board, comprising:
   hopper means for storing a plurality of chip type circuit elements;
   a plurality of accommodating means for temporarily accommodating circuit elements received from said hopper means, at least two of said accommodating means being oriented in respective different direction with respect to said apparatus;
   laterally movable shutter means having an operative position under said accommodating means, in which said shutter means supports said circuit elements in the respective ones of said accommodating means, and an inoperative position, in which said shutter means is removed from said accommodating means to permit discharge of said circuit elements from the latter;
   means operative with said shutter means in said operative position for laterally moving said shutter means so as to have components of movement in said different directions for ensuring orientation of the circuit elements in said different directions of the respective accommodating means; and
   a template located under said shutter means and having a plurality of receiving portions respectively corresponding to said accommodating means and into which the discharged circuit elements are allowed to fall when said shutter means is removed from said accommodating means to said inoperative position.

2. An apparatus for placing chip type circuit elements on a board according to claim 1; wherein each of said chip type circuit elements is elongated; and in which each of said accommodating means has a vertical portion to receive a circuit element with the direction of its elongation extended vertically and a horizontally extended portion having an upper surface and a lower surface which is defined by said shutter means in said operative position of the latter, said lower surface being extended horizontally at right angles to the axial line of said vertical portion and the vertical distance between said surfaces at the end of said extended portion remote from said vertical portion being smaller than the length of each said circuit element, such that a circuit element received by said vertical portion is constrained to horizontally in said extended portion in response to lateral moving of said shutter means in said operative position of the latter.

3. An apparatus for placing chip type circuit elements on a board according to claim 1; wherein each of said at least two accommodating means has a vertical portion and an extended portion which is extended horizontally at right angles to the axial line of said vertical portion and in the respective one of said different directions, such that when said shutter means is moved laterally by a predetermined distance in said respective direction in which said extended portion is extended, said circuit elements are turned in the direction in which said shutter means has moved.

4. An apparatus for placing chip type circuit elements on a board according to claim 1; wherein said accommodating means includes at least two kinds of guides, the guides of one type having a vertical portion and an extended portion which extends horizontally in a first direction at right angles with the axial line of said vertical portion, and the guides of another type having a vertical portion and an extended portion which extends in a second horizontal direction which is different from said first direction; said apparatus further comprising a first guide means which guides said shutter means in said first direction and a second guide means which guides said shutter means in said second direction, so that when said shutter means is moved by predetermined distances in said first and second directions, the circuit elements in said first and second guides are turned in said first and second directions, respectively.

5. An apparatus for placing chip type circuit elements on a board according to claim 4; wherein said shutter means comprises a support member which is movably supported on one of said guide means, and a thin shutter plate mounted on said support member.

6. An apparatus for placing chip type circuit elements on a board according to claim 5; wherein said shutter means has means for adjusting a tensile force exerted on the shutter plate.

7. An apparatus for placing chip type circuit elements on a board according to claim 1; wherein said template consists of at least a first plate and a second plate, and said receiving portions are formed in said first plate.

8. An apparatus for placing chip type circuit elements on a board according to claim 1; wherein said template consists of at least a first plate and a second plate, and said receiving portions consist of holes formed in at least one of said plates and having dissimilar depths to correspond to the sizes of the circuit elements fed from said accommodating means.

9. An apparatus for placing chip type circuit elements on a board according to claim 8; wherein said dissimilar depths are selected such that the top surfaces of said circuit elements are all flush with one another.

10. An apparatus for placing chip type circuit elements on a board according to claim 9; wherein the holes are formed in the first plate and the second plate has recessed portions which are matched to said holes.

11. An apparatus for placing chip type circuit elements on a board according to claim 1; said apparatus further comprising support means for supporting said template, and guide means for separating said support means from said accommodating means and from said shutter means, and for moving said support means independently thereof.

12. An apparatus for placing chip type circuit elements on a board according to claim 1; in which each of said circuit elements is elongated so as to have a longitudinal axis; and further comprising a plurality of transmitting means which convey said circuit elements from said hopper means to said accommodating means with the longitudinal axis of each of said circuit elements being aligned with its direction of travel through said transmitting means, and frame means which are attached to said accommodating means and which support said transmitting means, such that said transmitting, frame, and accommodating means form a magazine separable from said apparatus and movable as a unit independently thereof.

* * * * *